(12) United States Patent
Kang

(10) Patent No.: US 6,977,835 B2
(45) Date of Patent: Dec. 20, 2005

(54) FERROELECTRIC REGISTER, AND METHOD FOR MANUFACTURING CAPACITOR OF THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 39 days.

(21) Appl. No.: 10/734,168

(22) Filed: Dec. 15, 2003

(65) Prior Publication Data

US 2004/0240248 A1    Dec. 2, 2004

(30) Foreign Application Priority Data

May 30, 2003   (KR) ...................... 10-2003-0034708

(51) Int. Cl.[7] ............................................. G11C 11/22
(52) U.S. Cl. .................. 365/145; 365/149; 365/189.11
(58) Field of Search ............................... 365/145, 140, 365/189.11, 194

(56) References Cited

U.S. PATENT DOCUMENTS

| | | | |
|---|---|---|---|
| 6,067,244 A | 5/2000 | Ma et al. | |
| 6,272,594 B1 | 8/2001 | Gupta et al. | |
| 6,301,145 B1 | 10/2001 | Nishihara | |
| 6,314,016 B1 | 11/2001 | Takasu | |
| 6,363,439 B1 | 3/2002 | Battles et al. | |
| 6,809,951 B2 * | 10/2004 | Yamaguchi | 365/145 |

FOREIGN PATENT DOCUMENTS

| | | |
|---|---|---|
| KR | 1020010066806 A | 7/2001 |
| KR | 1020030040912 A | 5/2003 |

* cited by examiner

*Primary Examiner*—David Lam
(74) *Attorney, Agent, or Firm*—Heller Ehrman LLP

(57) ABSTRACT

The present invention discloses a ferroelectric register and a method for manufacturing a capacitor of the same. The ferroelectric register is configured to reduce probability of data storage failure due to a weak state capacitor, by connecting a plurality of capacitors in parallel in a ferroelectric capacitor unit for storing data, instead of using a single capacitor, thereby improving storage reliability and stability. In addition, the ferroelectric register obtains a data sensing margin by pumping a cell plate signal into not a power voltage level but a pumping voltage level.

9 Claims, 19 Drawing Sheets

FERROELECTRIC REGISTER, AND METHOD FOR MANUFACTURING CAPACITOR OF THE SAME

BACKGROUND OF THE INVENTION

1. Field of the Invention

The present invention relates to a ferroelectric register, and more particularly to a ferroelectric register configured to reduce probability of data storage failure by connecting a plurality of ferroelectric capacitors in parallel, thereby improving data storage reliability and stability.

2. Description of the Background Art

In general, a ferroelectric random access memory (Fe-RAM) has a data processing speed equivalent to a dynamic random access memory (DRAM), and preserves data even when power is off.

The FeRAM is a memory having a similar structure to the DRAM. The FeRAM employs a ferroelectric substance to form capacitors, and thus uses high remanent polarization which is a property of the ferroelectric substance. Even if electric fields are removed, data are not deleted in the FeRAM due to the remanent polarization.

FIG. 1 is a hysteresis loop provided to explain properties of a general ferroelectric capacitor.

Referring to FIG. 1, although electric fields are removed in electric field induced polarizations, the ferroelectric capacitor maintains a predetermined amount (A and D) of remanent polarizations (or spontaneous polarizations).

An FeRAM cell introduces the states (D and A) of the remanent polarization to data '1'and '0', respectively, and applies them to memory elements.

FIG. 2 is a diagram illustrating a unit cell of the general FeRAM.

As illustrated in FIG. 2, a bit line BL is formed in one direction, and a word line WL is formed in the direction crossing the bit line BL. A plate line PL is formed in parallel to the word line WL at a predetermined interval. An NMOS transistor has its gate terminal connected to the word line WL, and its source terminal connected to the bit line BL. A ferroelectric capacitor FC has its first terminal connected to the drain terminal of the NMOS transistor, and its second terminal connected to the plate line PL.

In the normal state, the ferroelectric capacitor FC has hysteresis properties of loop A of FIG. 3, but in the weak state, the ferroelectric capacitor FC has deformed properties of loop B of FIG. 3. Therefore, the weak state remanent polarization is much smaller than the normal state remanent polarization.

If the weak state ferroelectric capacitor is used, the remanent polarization thereof is so small that a register may not store nonvolatile data in a power-up mode.

SUMMARY OF THE INVENTION

The present invention is achieved to solve the above problems. Accordingly, it is an object of the present invention to store data more reliably, by improving the structure of ferroelectric capacitors for storing data in a register using the ferroelectric capacitors.

In order to achieve the above-described object of the invention, a ferroelectric register comprises a pull-up switch, a pull-up driving unit, a write enable control unit, a ferroelectric capacitor unit, a pull-down switch and a pull-down driving unit. The pull-up switch outputs a power voltage when a pull-up enable signal is activated. The pull-up driving unit receives the output voltage from the pull-up switch, and pulls up a voltage of a data storage node for storing a differential data to the power voltage. The write enable control unit transmits the differential data to the data storage node according to a write control signal. The ferroelectric capacitor unit, which includes at least two ferroelectric capacitors connected in parallel between the data storage node and a plate line, stores the differential data when a cell plate signal is activated. The pull-down switch transmits a ground voltage to the data storage node when a pull-down enable signal is activated. The pull-down driving unit receives the ground voltage from the pull-down switch, and pulls down the voltage of the data storage node to the ground voltage.

According to one aspect of the invention, a method for manufacturing a capacitor of a ferroelectric register includes: a first process for forming at least two bottom electrode layers commonly connected to an output terminal of the register; a second process for forming a ferroelectric layer commonly corresponding to at least two bottom electrode layers on the two bottom electrode layers; and a third process for forming a top metal layer receiving a cell plate signal and commonly corresponding to at least two bottom electrode layers on the ferroelectric layer.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Preferred embodiments of the present invention will be described in detail with reference to the accompanying drawings.

Figure 4:
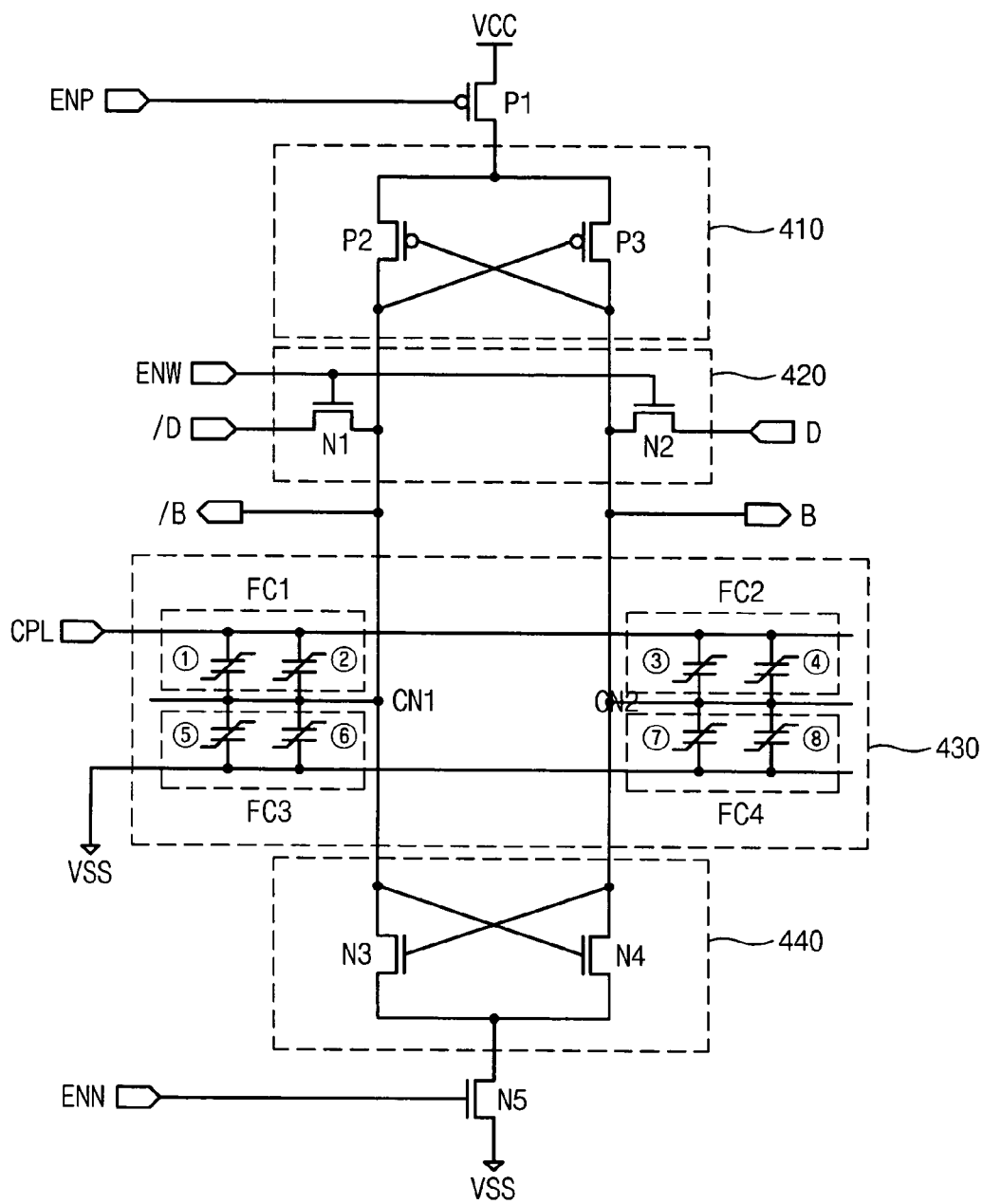
FIG. 4 is a detailed circuit diagram illustrating a ferroelectric register in accordance with the present invention.

FIG. 4 is a detailed circuit diagram illustrating a ferroelectric register in accordance with the present invention.

The ferroelectric register includes a pull-up switch P1, a pull-up driving unit 410, a write enable control unit 420, a ferroelectric capacitor unit 430, a pull-down driving unit 440 and a pull-down switch N5.

The pull-up switch P1 outputs a power voltage VCC to the pull-up driving unit 410 when a pull-up enable signal ENP is activated. The pull-up switch P1 is connected between the power voltage terminal VCC and the pull-up driving unit 410, and has its gate terminal connected to receive the pull-up enable signal ENP.

The pull-up driving unit 410 receives the power voltage VCC from the pull-up switch P1, and pulls up voltages of data storage nodes CN1 and CN2 to the power voltage VCC.

The pull-up driving unit 410 is positioned between the pull-up switch P1 and the write enable control unit 420, and includes PMOS transistors P2 and P3 connected in a latch structure between the nodes CN1 and CN2.

The write enable control unit 420 receives differential data D and /D according to a write enable signal ENW. The write enable control unit 420 includes NMOS transistors N1 and N2 which are respectively connected between the data input terminals and the nodes CN1 and CN2, and which have their gate terminals commonly connected to receive the write control signal ENW.

The ferroelectric capacitor unit 430 stores the data D and /D from the write enable control unit 420 by generating a voltage difference between the nodes CN1 and CN2 in response to a cell plate signal CPL.

The ferroelectric capacitor unit 430 includes a plurality of capacitor units FC1~FC4 formed by connecting at least two ferroelectric capacitors in parallel. In accordance with the present invention, the ferroelectric capacitor unit 430 is formed by connecting at least two ferroelectric capacitors in parallel, and a data '0' or '1' is sensed by using average remanent polarization of the ferroelectric capacitors connected in parallel. Therefore, even if any one of the ferroelectric capacitors of the capacitor units FC1~FC4 has a weak state, it can be compensated by the other normal state ferroelectric capacitor. Accordingly, the average remanent polarization of the capacitor units FC1~FC4 exists within the normal state data sensing margin range.

The structure of the capacitor units FC1~FC4 will now be explained.

In the capacitor unit FC1, the ferroelectric capacitors 1 and 2 connected in parallel have their one side ends commonly connected to the node CN1, and their other side ends connected to receive the cell plate signal CPL. In the capacitor unit FC2, the ferroelectric capacitors 3 and 4 connected in parallel have their one side ends commonly connected to the node CN2, and their other side ends connected to receive the cell plate signal CPL.

In the capacitor unit FC3, the plurality of ferroelectric capacitors 5 and 6 are connected in parallel between the node CN1 and a ground voltage terminal VSS. In the capacitor unit FC4, the plurality of ferroelectric capacitors 7 and 8 connected in parallel between the node CN2 and the ground voltage terminal VSS.

The pull-down driving unit 440 is connected in a latch structure between the nodes CN1 and CN2, for pulling down the voltages of the nodes CN1 and CN2 to the ground voltage VSS from the pull-down switch N5. The pull-down driving unit 440 is positioned between the ferroelectric capacitor unit 430 and the pull-down switch N5, and includes NMOS transistors N3 and N4 connected in a latch structure between the nodes CN1 and CN2.

The pull-down switch N5 transmits the ground voltage VSS to the pull-down driving unit 440 when a pull-down enable signal ENN is activated. The pull-down switch N5 is connected between the pull-down driving unit 440 and the ground voltage terminal VSS, and has its gate terminal connected to receive the pull-down enable signal ENN.

In addition, the ferroelectric register outputs the stored data through output terminals B and /B.

FIGS. 5 to 8 are detailed structure diagrams respectively illustrating the capacitor units FC1~FC4 of the ferroelectric capacitor unit 430 in accordance with a first embodiment of the present invention.

FIGS. 5 to 8 illustrate the plurality of ferroelectric capacitors connected in parallel side by side.

Figure 5:
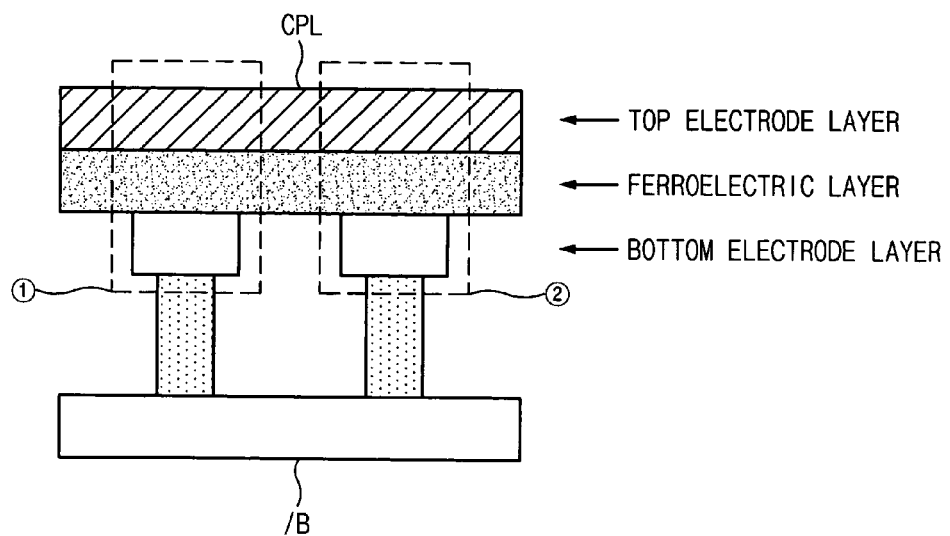
FIGS. 5 to 8 are detailed structure diagrams respectively illustrating capacitor units of a ferroelectric capacitor unit in accordance with a first embodiment of the present invention.

FIG. 5 shows the capacitor unit FC1. Two bottom electrode layers corresponding respectively to the two capacitors 1 and 2 connected in parallel are formed, and one ferroelectric layer commonly corresponding to the two bottom electrode layers is formed on the bottom electrode layers. Thereafter, a cell plate electrode layer (or metal electrode layer connected to the cell plate electrode layer) is formed on the ferroelectric layer as a top electrode layer of the ferroelectric capacitors 1 and 2. The two bottom electrode layers are electrically connected to the output terminal /B of the register.

A capacitor unit can be formed in the same manner by connecting at least three ferroelectric capacitors in parallel.

Figure 6:
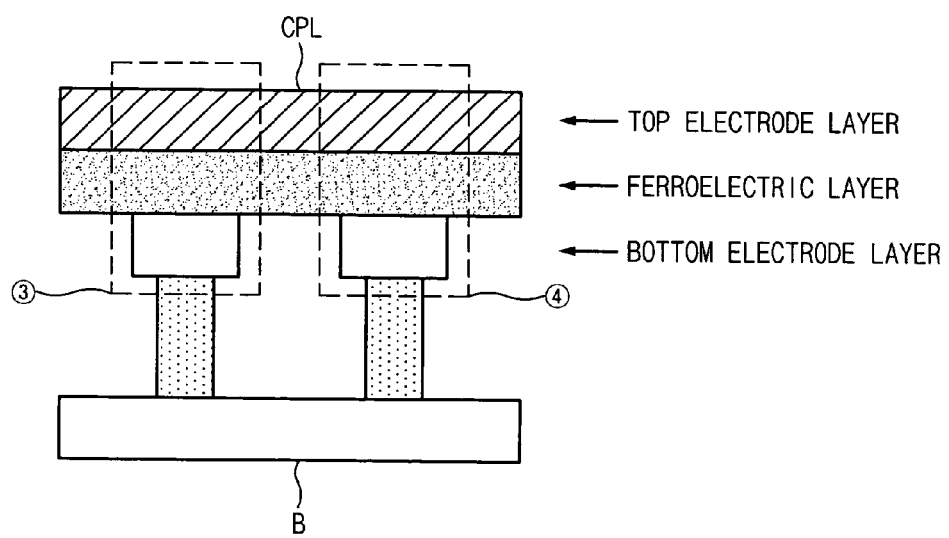
Figure 7:
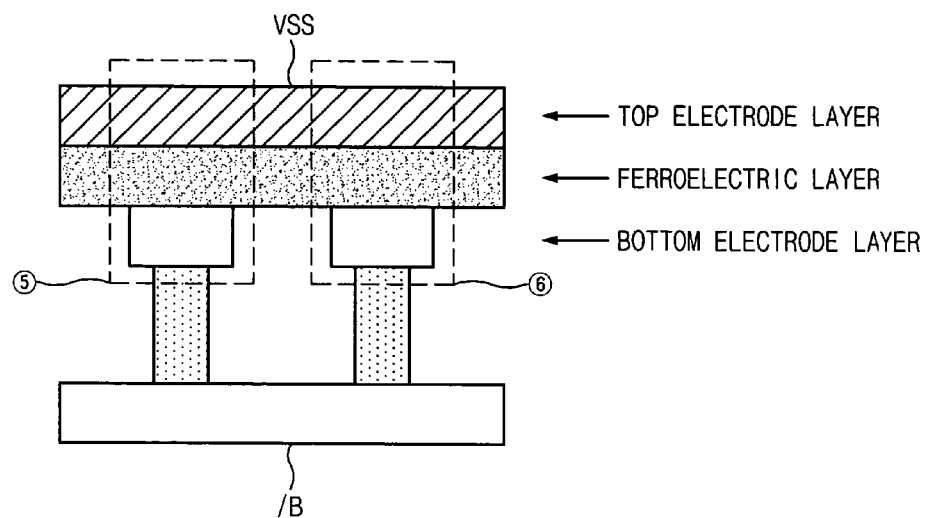
Figure 8:
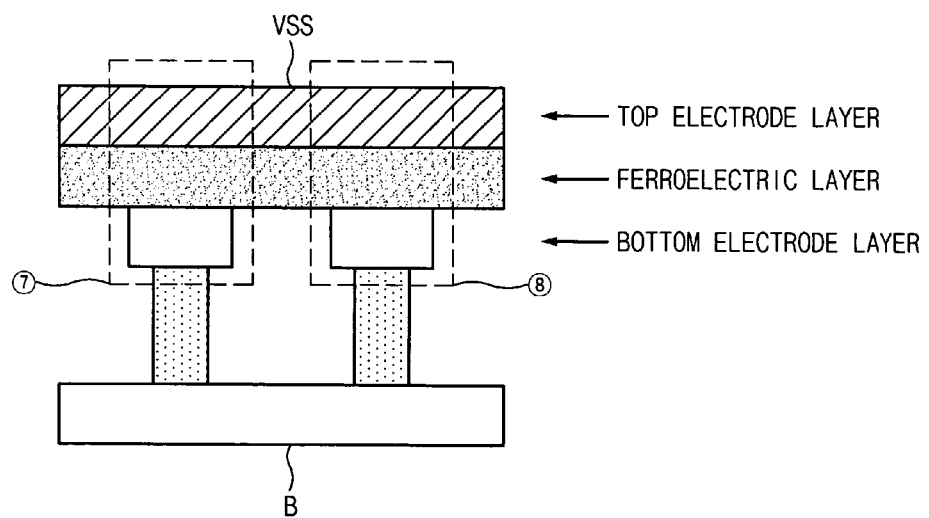

FIG. 6 illustrates the capacitor unit FC2 in accordance with the first embodiment of the present invention. The capacitor unit FC2 has the same structure and formation method as the capacitor unit FC1 of FIG. 5. FIGS. 7 and 8 show the capacitor units FC3 and FC4 in accordance with the first embodiment of the present invention. Here, a top electrode layer is not connected to a cell plate electrode layer but connected to a ground voltage terminal VSS (or load power).

Figure 9:
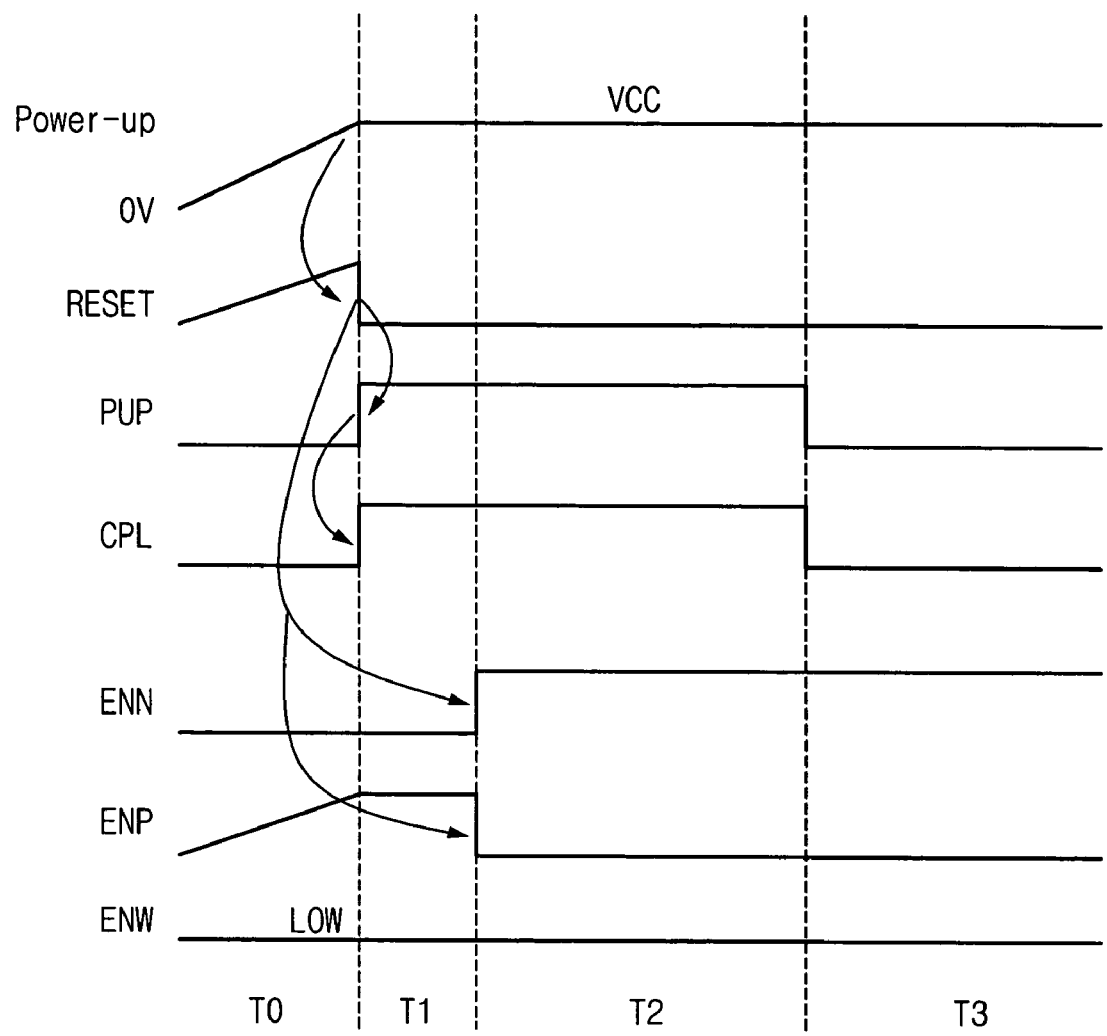
FIG. 9 is an operational timing diagram in a power-up mode of the ferroelectric register in accordance with the present invention.

FIG. 9 is an operational timing diagram in a power-up mode of the ferroelectric register in accordance with the present invention.

When the power voltage VCC reaches a predetermined level in Ti period after power-up, a reset signal RESET is generated, and a power-up sensing signal PUP is enabled due to generation of the reset signal RESET.

Thereafter, the cell plat signal CPL is transited to a high level according to enabling of the power-up sensing signal PUP. Here, the voltage difference is generated between the cell both end nodes CN1 and CN2 by electric charges stored in the capacitor units FC1~FC4 of the register.

In T2 period, when the sufficient voltage difference is generated between the cell both end nodes CN1 and CN2, the pull-down enable signal ENN is enabled to a high level and the pull-up enable signal ENP is disabled to a low level, thereby amplifying the data of the cell both end nodes CN1 and CN2. The amplified data are an average value of the two ferroelectric capacitors connected in parallel.

In T3 period, when data amplification of the cell both end nodes CN1 and CN2 is finished, the power-up sensing signal PUP and the cell plate signal CPL are transited again to a low level. Accordingly, the destroyed data of the capacitor unit FC1 or FC2 is restored.

Here, the write control signal ENW maintains a low level to prevent an external data from being re-written.

Figure 10:
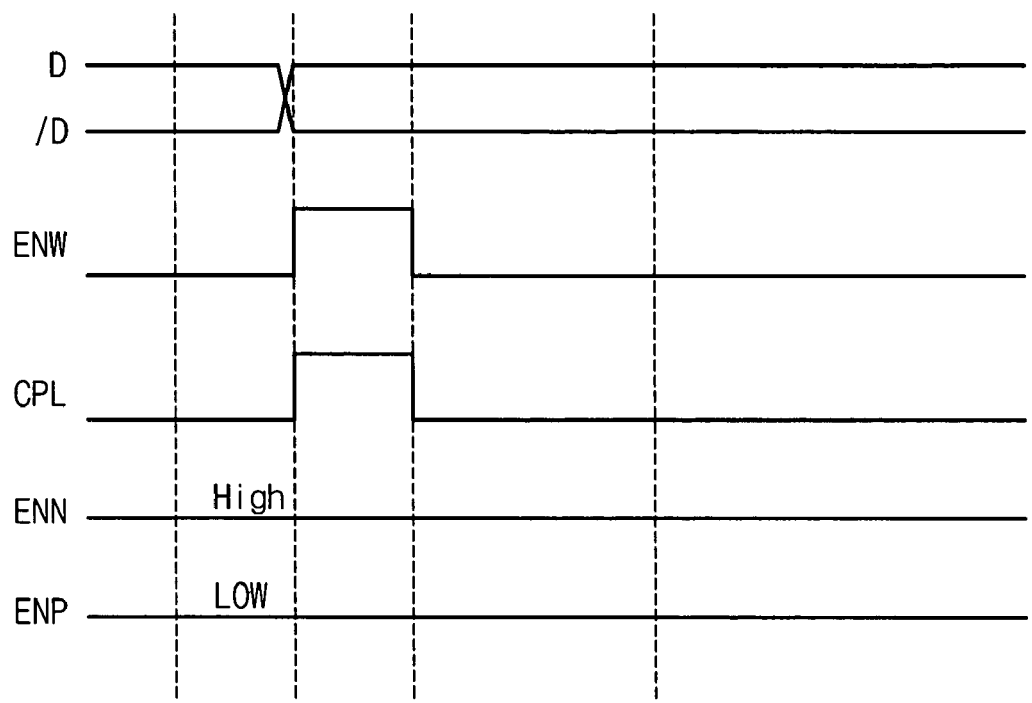
FIG. 10 is an operational timing diagram for setting a new data in the register in a program write operation in accordance with the present invention.

FIG. 10 is an operational timing diagram for setting a new data in the register in a program write operation in accordance with the present invention.

Figure 1:
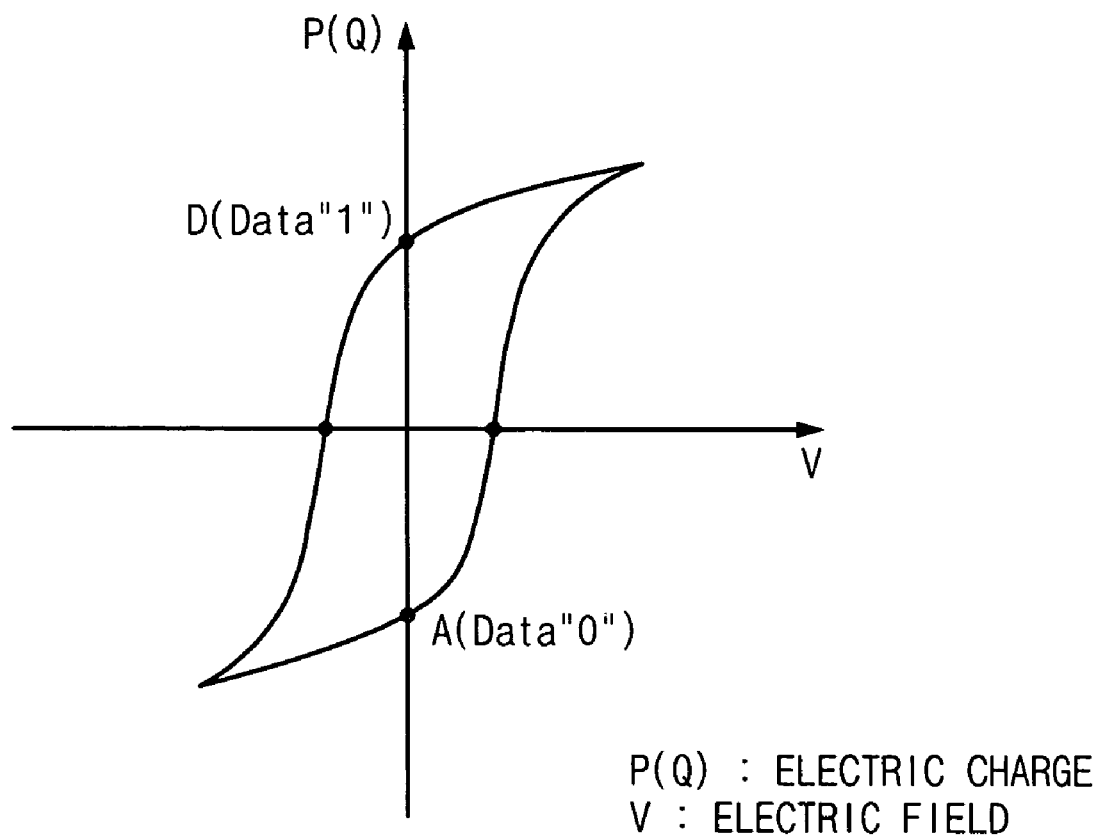
FIG. 1 is a hysteresis loop showing properties of a general ferroelectric capacitor.
Figure 2:
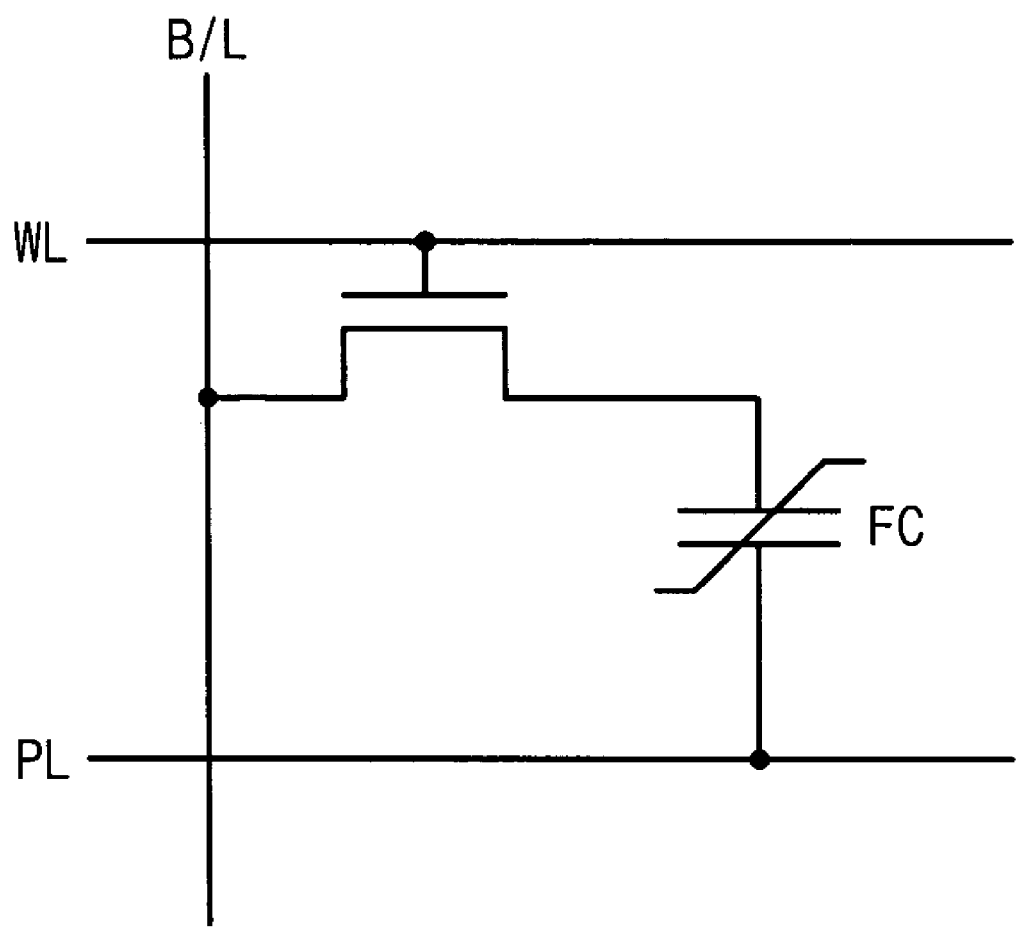
FIG. 2 is a diagram illustrating a unit cell of a general FeRAM.
Figure 3:
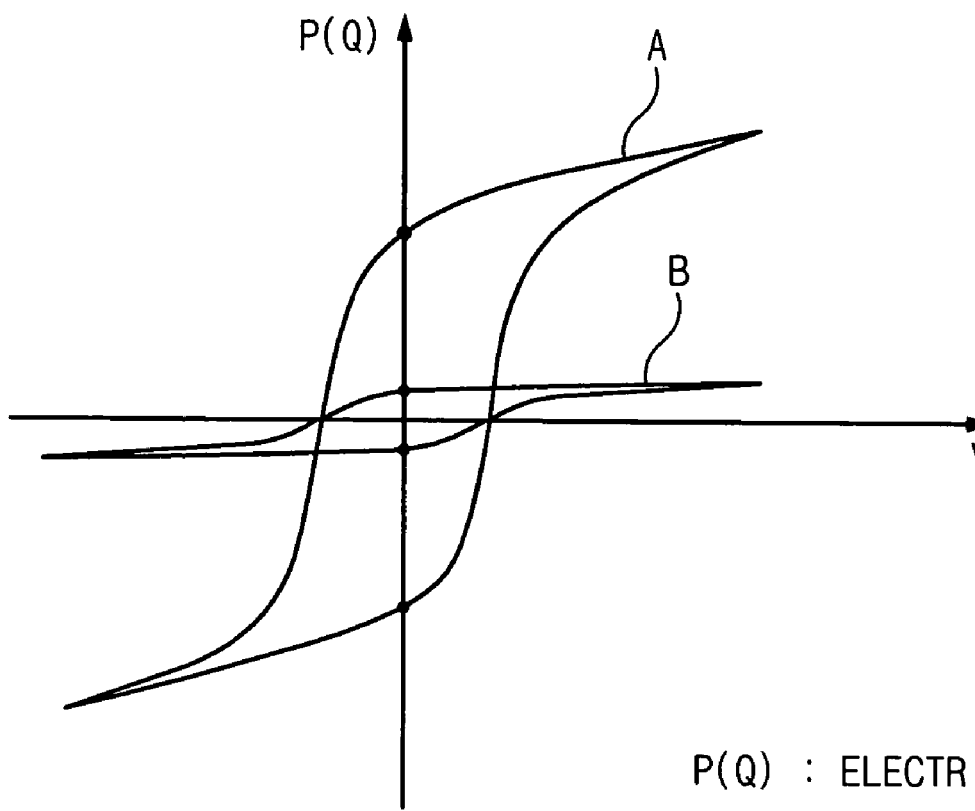
FIG. 3 is a diagram showing properties of the ferroelectric capacitor in the normal and weak states.

When a predetermined time elapses after transmission of a command signal, new differential data D and /D are respectively inputted and stored in the capacitor units FC1 and FC2. If each capacitor unit FC or FC2 includes only one ferroelectric capacitor and the ferroelectric capacitor has a weak state, remanent polarization of the ferroelectric capacitor is out of a data sensing margin as shown in B of FIG. 3. In this case, the register may not store nonvolatile data.

However, when at least two ferroelectric capacitors are connected in parallel as in the present invention, the average remanent polarization of the capacitors connected in parallel is sensed. Accordingly, even if any one of the ferroelectric capacitors has a weak state, it can be compensated by the other normal state ferroelectric capacitor.

In the case that the two ferroelectric capacitors have a weak state, the average value thereof is too small to store data. However, it has low possibility that the two ferroelectric capacitors have a weak state at the same time. Moreover, when at least three capacitors are connected in parallel, it hardly happens.

When the input data D from a data I/O pad is disabled from a high to low level, a program cycle starts. Therefore, the write control signal ENW for writing a new data in the register and the cell plate signal CPL are transited to a high level. Here, the pull-down enable signal ENN maintains a high level and the pull-up enable signal ENP maintains a low level.

As described above, each of the capacitor units FC1~FC4 of the ferroelectric capacitor unit 430 is formed by connecting the plurality of ferroelectric capacitors in parallel, to remarkably reduce data storage failure probability.

FIGS. 11 to 14 are detailed structure diagrams respectively illustrating capacitor units FC1~FC4 of a ferroelectric capacitor unit 430 in accordance with a second embodiment of the present invention.

The first embodiment of the invention has suggested the capacitor units formed by connecting the ferroelectric capacitors 12, 34, 56 and 78 in parallel side by side.

In order to more reduce a layout area, the second embodiment of the invention provides the capacitor units FC1~FC4 formed by connecting a plurality of ferroelectric capacitors in parallel in a three-dimensional stack type.

Figure 11:
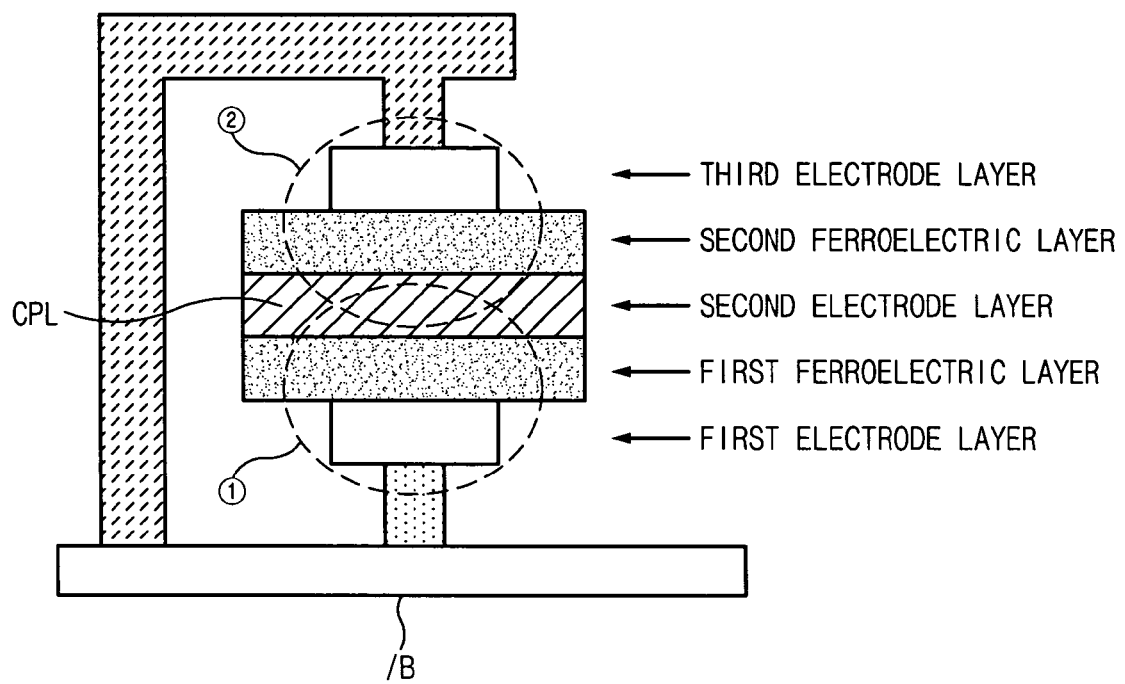
FIGS. 11 to 14 are detailed structure diagrams respectively illustrating capacitor units of a ferroelectric capacitor unit in accordance with a second embodiment of the present invention.

For example, as shown in the capacitor unit FC1 of FIG. 11, a first electrode layer (bottom electrode layer), a first ferroelectric layer and a second electrode layer (top electrode layer) corresponding to the ferroelectric capacitor 1 are sequentially formed. A second ferroelectric layer and a third electrode layer (bottom electrode layer) corresponding to the ferroelectric capacitor 2 are sequentially formed on the second electrode layer. Here, the first electrode layer and the third electrode layer corresponding to the bottom electrode layers of the ferroelectric capacitors 1 and 2 are electrically connected to an output terminal /B, and the second electrode layer is used as a common top electrode layer of the two ferroelectric capacitors 1 and 2, for receiving a cell plate signal CPL.

That is, the first electrode layer, the first ferroelectric layer and the second electrode layer compose the capacitor 1, and the second ferroelectric layer and the third electrode layer are stacked symmetrically to the first ferroelectric layer and the first electrode layer from the second electrode layer used as the common top electrode layer, to compose the capacitor 2. The third electrode layer is electrically connected to the output terminal /B.

The process for connecting the ferroelectric capacitors in parallel in the stack type will now be briefly explained.

A contact plug is formed on the bit line B or /B which is an output terminal, and the first electrode layer, the first ferroelectric layer, the second electrode layer, the second ferroelectric layer and the third electrode layer are sequentially stacked on the contact plug. Here, the first and second ferroelectric layers may include at least one dielectric film.

An insulation film is formed on the third electrode layer. A first contact hole for opening a predetermined area of the bit line B or /B and a second contact hole for opening a predetermined area of the third electrode layer are formed on the insulation film. A metal process is performed on the resulting structure, to form a metal line for commonly connecting the bit line B or /B to the third electrode layer.

Figure 12:
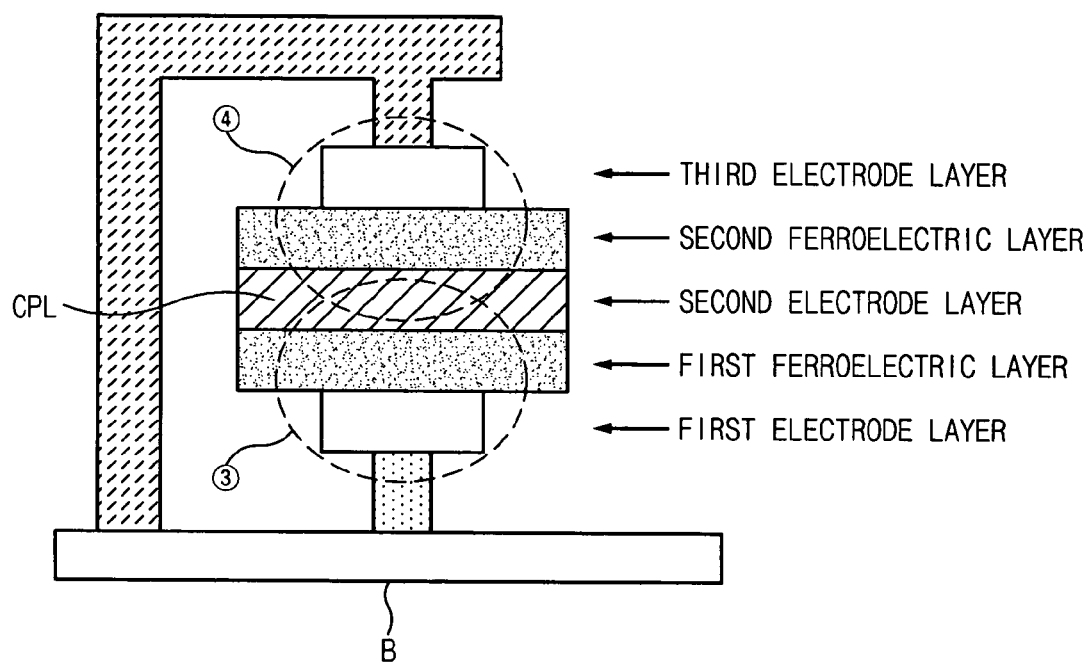
Figure 13:
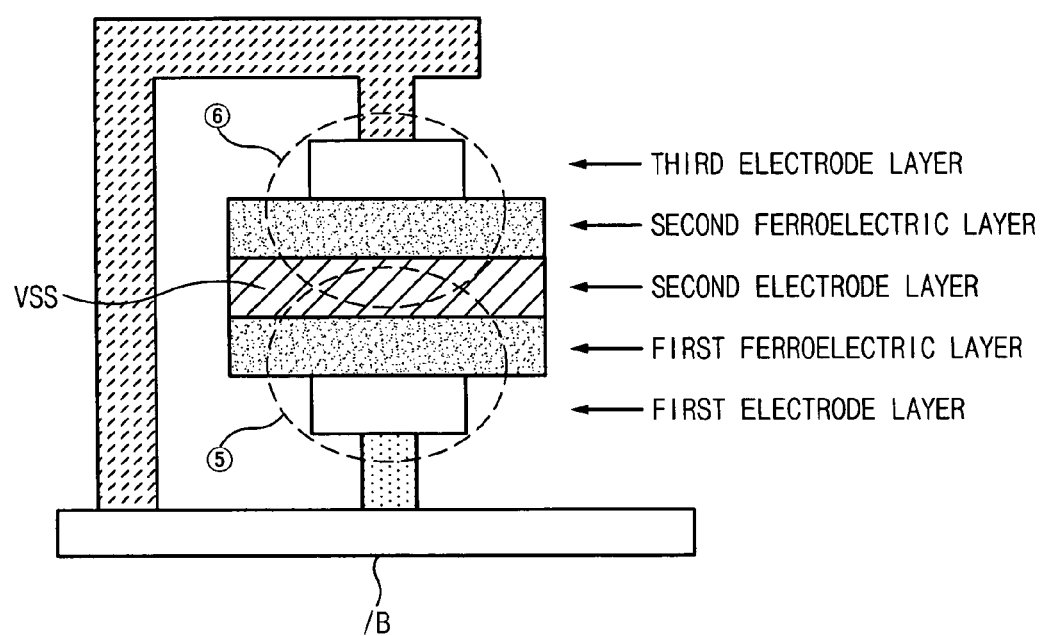
Figure 14:
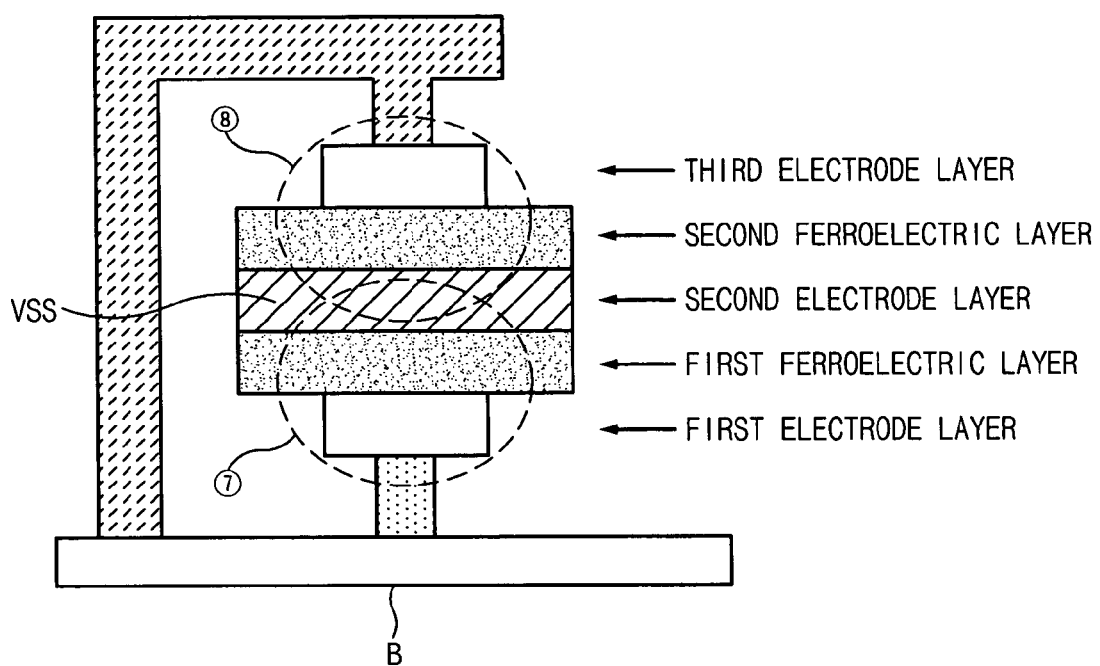

FIG. 12 illustrates the capacitor unit FC2 in accordance with the second embodiment of the present invention. The capacitor unit FC2 has the same structure and formation method as the capacitor unit FC1 of FIG. 11. FIGS. 13 and 14 respectively show the capacitor units FC3 and FC4 in accordance with the second embodiment of the present invention. Differently from the capacitor units FC1 and FC2 of FIGS. 11 and 12, a second electrode layer (common top electrode layer) is connected to the ground voltage terminal VSS.

In the above embodiments, two ferroelectric capacitors are connected in parallel. It is apparent that more ferroelectric capacitors can be connected in parallel. For example, four capacitors can be formed side by side or stacked on the same plane, to compose one capacitor unit.

Figure 15A:
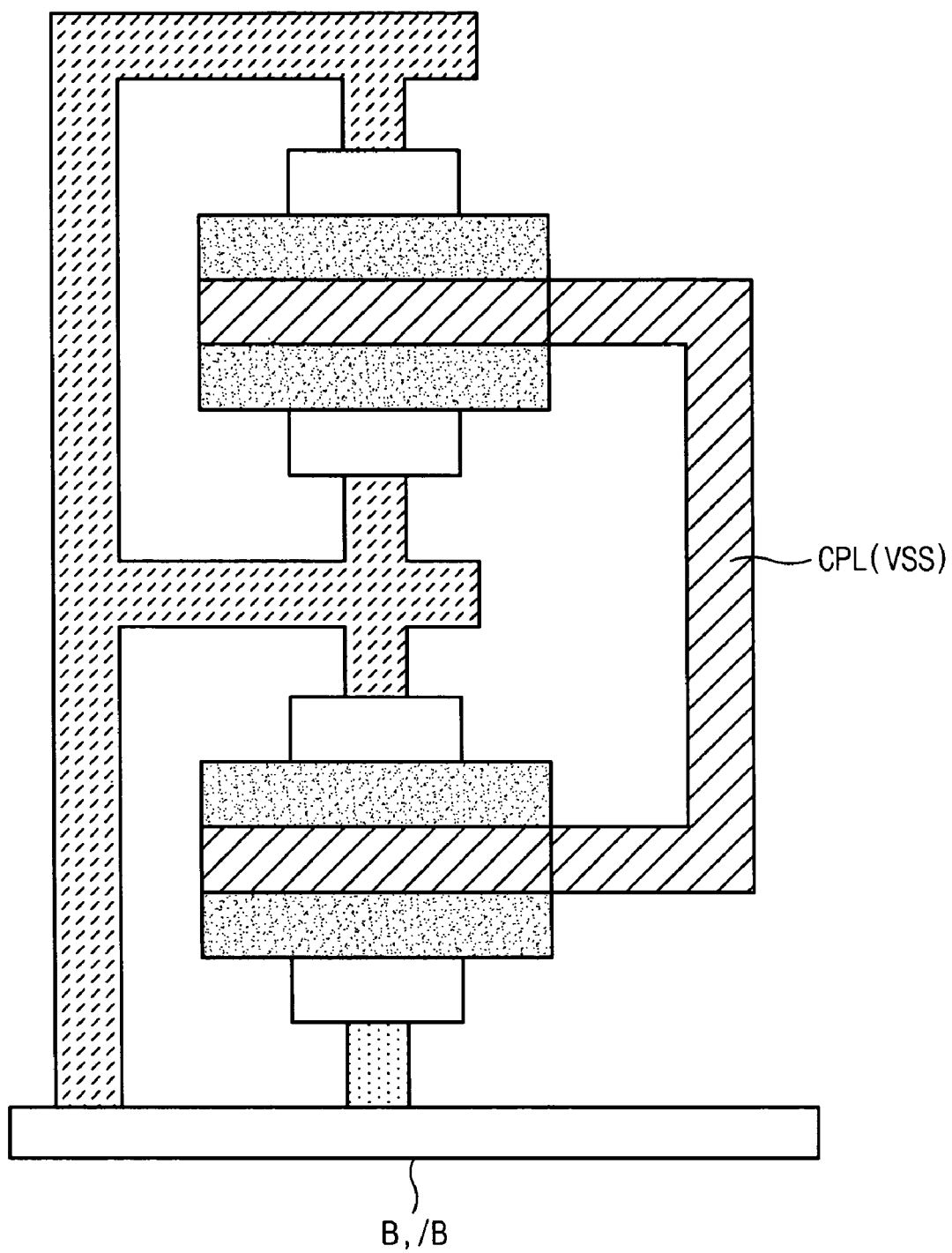
FIGS. 15a and 15b are diagrams illustrating four ferroelectric capacitors connected in parallel in a stack type.
Figure 15B:
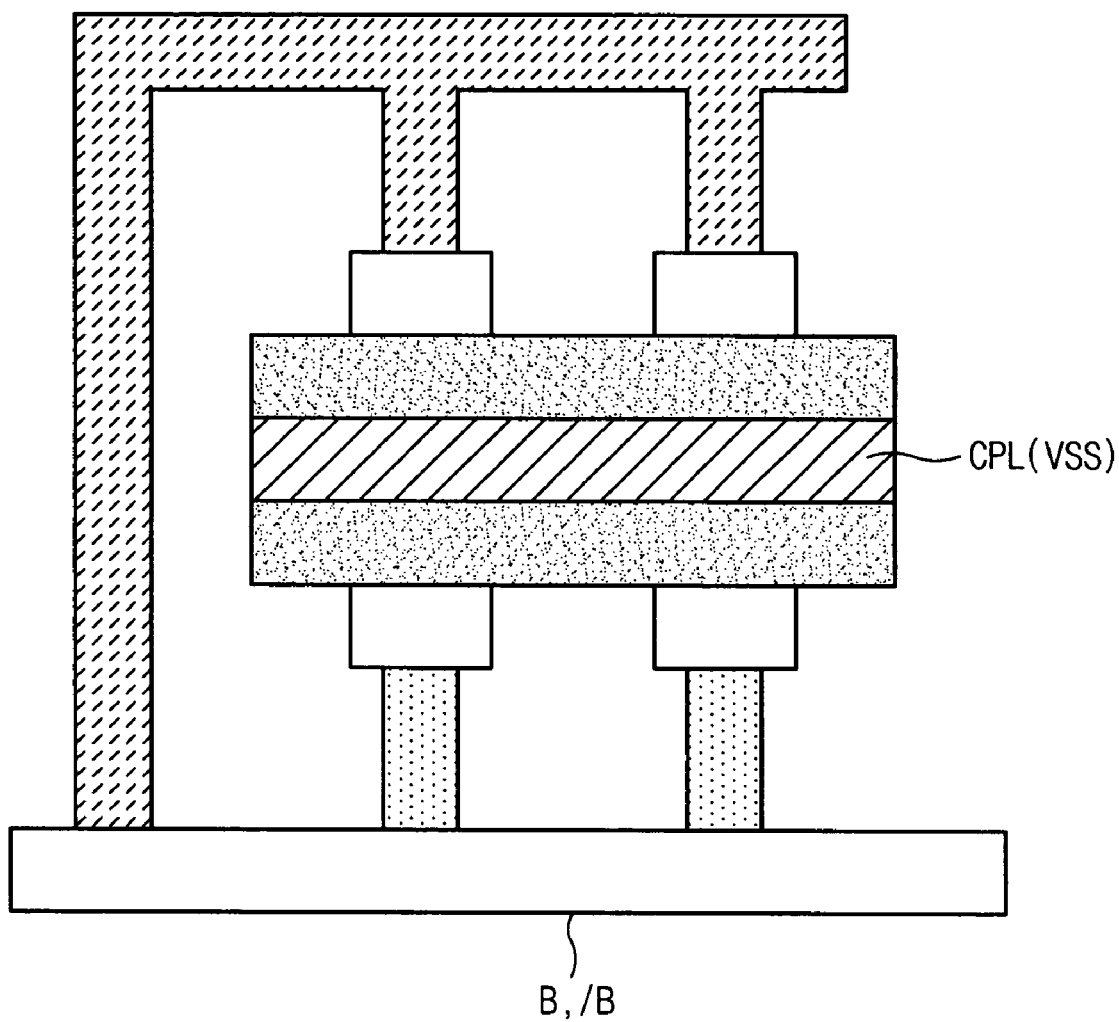

FIGS. 15a and 15b are diagrams illustrating four ferroelectric capacitors connected in parallel.

In FIG. 15a, the structures of FIG. 11 are double stacked and related layers are electrically connected. More structures of FIG. 11 can be stacked in the same manner as FIG. 15a so that more ferroelectric capacitors can be connected in parallel.

In FIG. 15b, the structures of FIG. 5 are stacked symmetrically in the up/down direction as shown in FIG. 11.

Figure 16:
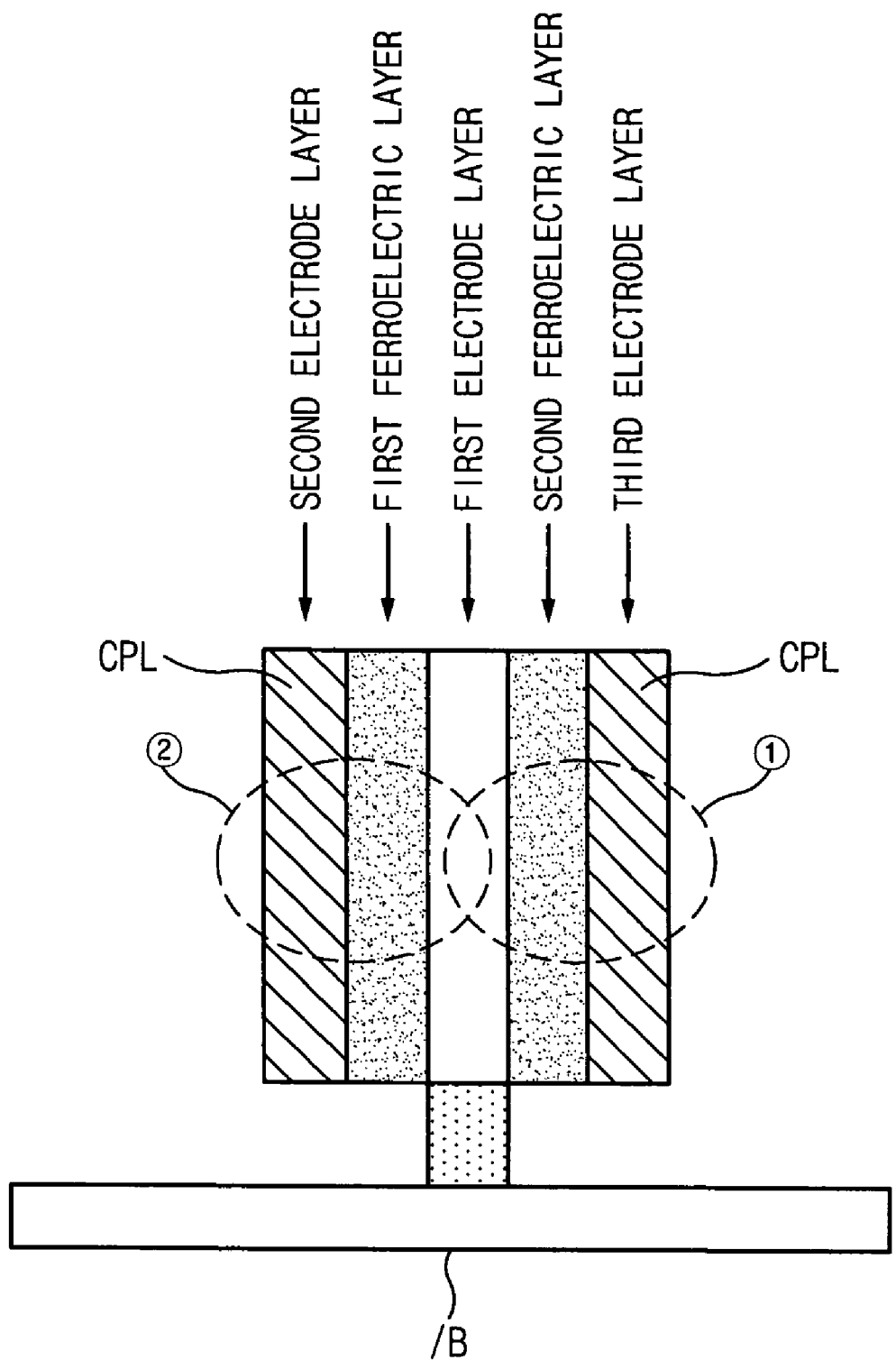
FIG. 16 is a structure diagram illustrating a capacitor unit in accordance with a third embodiment of the present invention.

FIG. 16 is a structure diagram illustrating a capacitor unit in accordance with a third embodiment of the present invention.

Differently from the first and second embodiments, electrode layers are formed in the vertical direction.

That is, a first electrode layer connected to an output terminal /B (or B) is formed in the vertical direction. A first ferroelectric layer and a second electrode layer (capacitor 1) and a second ferroelectric layer and a third electrode layer (capacitor 2) are respectively formed in the vertical direction symmetrically from the first electrode layer (common bottom electrode layer) in the right/left direction.

In the ferroelectric register, a pumping voltage VPP greater than an external power voltage VCC is preferably used as a cell plate signal CPL, to stably obtain a sensing margin.

Figure 17:
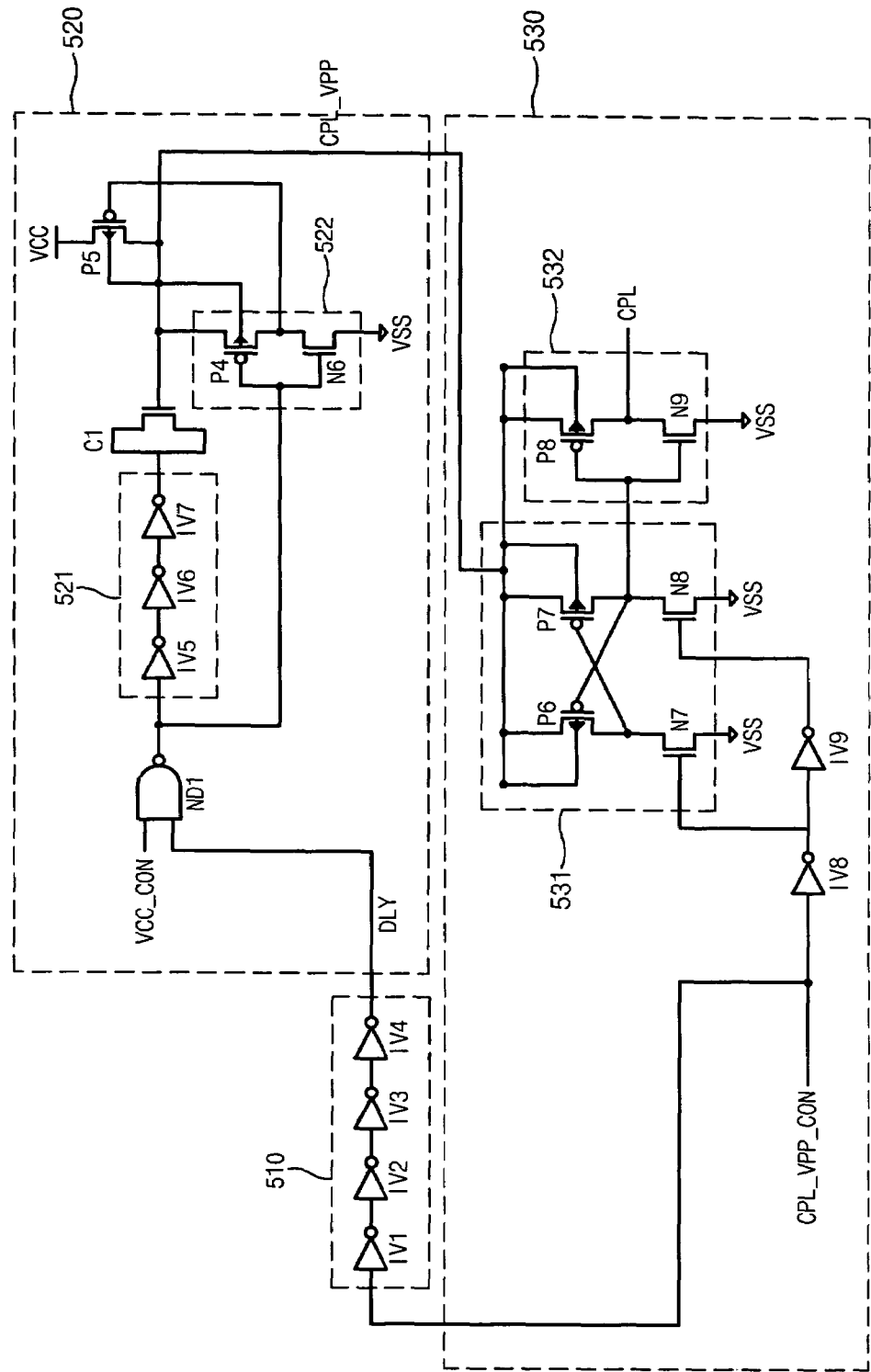
FIG. 17 is a circuit diagram illustrating a cell plate voltage control unit in accordance with the present invention.

FIG. 17 is a circuit diagram illustrating a cell plate voltage control unit for increasing the cell plate signal CPL to the pumping voltage VPP level in the ferroelectric register in accordance with the present invention.

The cell plate voltage control unit includes a delay unit 510, a pumping unit 520 and a level control unit 530.

The delay unit 510 is comprised of an inverter chain IV1~IV4 for outputting a delay signal DLY by non-inversely delaying a cell plate control signal CPL_VPP_CON.

When receiving a power voltage control signal VCC_CON, the pumping unit 520 outputs a pumping voltage VPP level pumping signal by pumping the power voltage VCC according to the delay signal DLY from the delay unit 510. The pumping unit 520 includes a NAND gate ND1, a delay unit 521, a MOS capacitor C1, a driving unit 522 and a PMOS transistor P5 which is a pull-up driving device.

Here, the NAND gate ND1 NANDs the power voltage control signal VCC_CON and the delay signal DLY, and the delay unit 521 includes an inverter chain IV5~IV7 for inversely delaying the output signal from the NAND gate ND1. The MOS capacitor C1 pumps the voltage level of the pumping signal CPL_VPP precharged to the power voltage VCC level according to enabling of the PMOS transistor P5. The PMOS transistor P5 is connected between the power voltage terminal VCC and the output terminal of the MOS capacitor C1, and has its gate terminal connected to receive the output signal from the driving unit 522. The driving unit 522 includes a PMOS transistor P4 and an NMOS transistor N6 which are connected in series between the drain terminal of the PMOS transistor P5 and the ground voltage terminal VSS, and which have their common gate terminals connected to receive the output signal from the NAND gate ND1.

The level control unit 530 includes inverters IV8 and IV9, a level shifter 531 and a driving unit 532.

The inverter IV8 inverts the cell plate control signal CPL_VPP_CON, and the inverter IV9 inverts the output signal from the inverter IV8.

The level shifter 531 includes PMOS transistors P6 and P7 and NMOS transistors N7 and N8 composing a latch structure, and level-shifts the pumping signal CPL_VPP according to the output state of the inverters IV8 and IV9. In the level shifter 531, the PMOS transistors P6 and P7 have their common source terminals connected to receive the pumping signal CPL_VPP, and their gate terminals cross-coupled to each other's drain terminals. The NMOS transistor N7 is connected between the drain terminal of the PMOS transistor P6 and the ground voltage VSS, and has its gate terminal connected to receive the output signal from the inverter IV8. The NMOS transistor N8 is connected between the drain terminal of the PMOS transistor P7 and the ground voltage VSS, and has its gate terminal connected to receive the output signal from the inverter IV9.

The driving unit 532 outputs the cell plate signal CPL by driving the pumping signal CPL_VPP according to the output signal from the level shifter 531. The driving unit 532 includes a PMOS transistor P8 and an NMOS transistor N9. The PMOS transistor P8 and the NMOS transistor N9 are connected in series between the pumping signal terminal CPL_VPP and the ground voltage terminal VSS, and have their gate terminals commonly connected to receive the output signal from the level shifter 531. The PMOS transistor P8 and the NMOS transistor N9 output the cell plate signal CPL through their common drain terminals.

Figure 18:
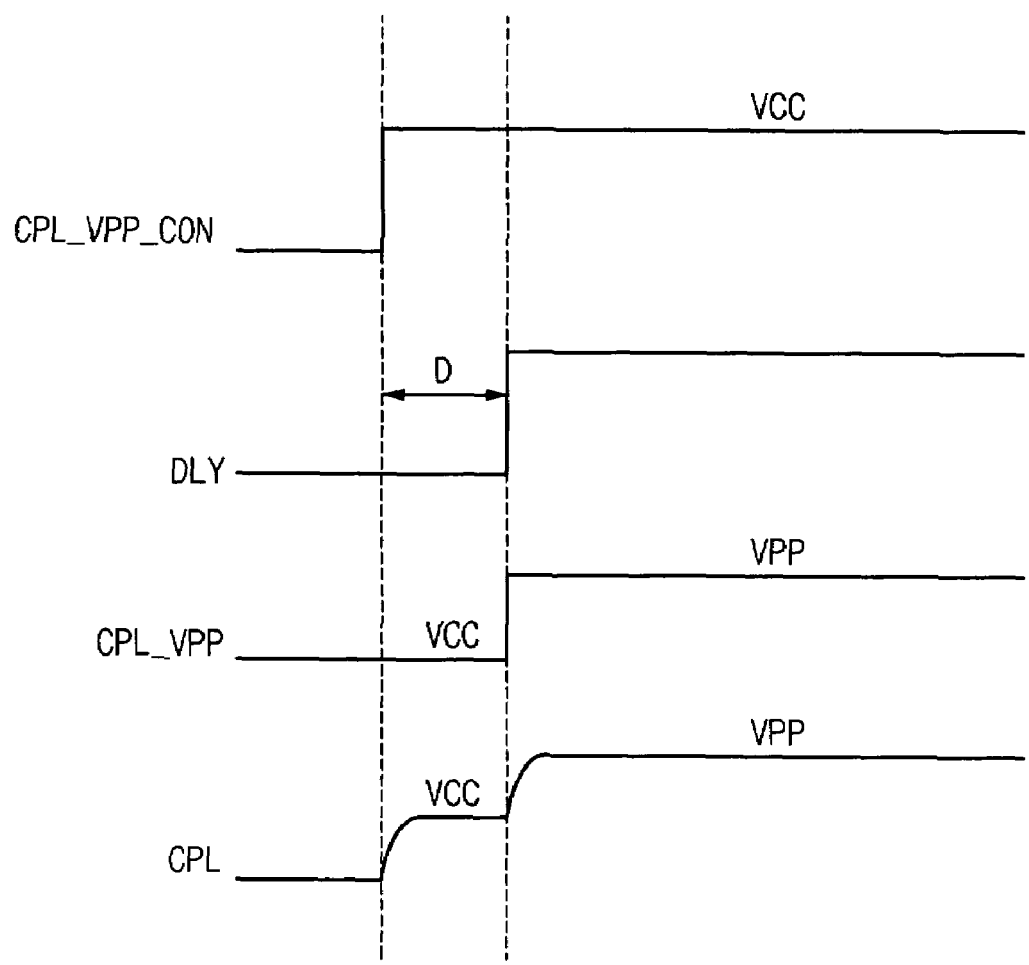
FIG. 18 is a waveform diagram provided to explain an operation of the cell plate voltage control unit.

FIG. 18 is a waveform diagram provided to explain an operation of the cell plate voltage control unit.

In order to pump the power voltage VCC in a low voltage area, the power voltage control signal VCC_CON and the cell plate control signal CPL_VPP_CON are inputted in a high level. In this case, the cell plate control signal CPL_VPP_CON is delayed by the delay unit 510 for a predetermined time D, and outputted as the delay signal DLY.

Accordingly, in the delay time D, the power voltage control signal VCC_CON has a high level, the delay signal DLY maintains a low level, and thus the output from the NAND gate ND1 has a high level.

The NMOS transistor N6 of the driving unit 522 is turned on by the output from the NAND gate ND1, and thus the PMOS transistor P5 is turned on, thereby the output terminal of the MOS transistor C1 is precharged to the power voltage VCC. Therefore, the pumping signal CPL_VPP maintains the power voltage VCC level according to the output from the MOS capacitor C1.

When the cell plate control signal CPL_VPP_CON has a high level, the NMOS transistor N8 is turned on, and the level shifter 531 outputs a low level signal. Accordingly, the PMOS transistor P8 of the driving unit 532 is turned on, and the cell plate signal CPL is outputted in the power voltage VCC level.

After the delay time D elapses, the output DLY from the delay unit 521 is enabled to a high level, and the output from the NAND gate ND1 has a low level. Therefore, the PMOS transistor P4 of the driving unit 522 is turned on, and the PMOS transistor P5 is turned off. The power voltage VCC is pumped according to the output from the MOS capacitor C1, and thus the pumping signal CPL_VPP is outputted in the pumping voltage VPP level.

Thereafter, when the output from the level shifter 531 has a low level, the PMOS transistor P8 of the driving unit 532 is turned on. Therefore, the cell plate signal CPL is outputted in the pumping voltage VPP level according to the high level pumping signal CPL_VPP.

Figure 19:
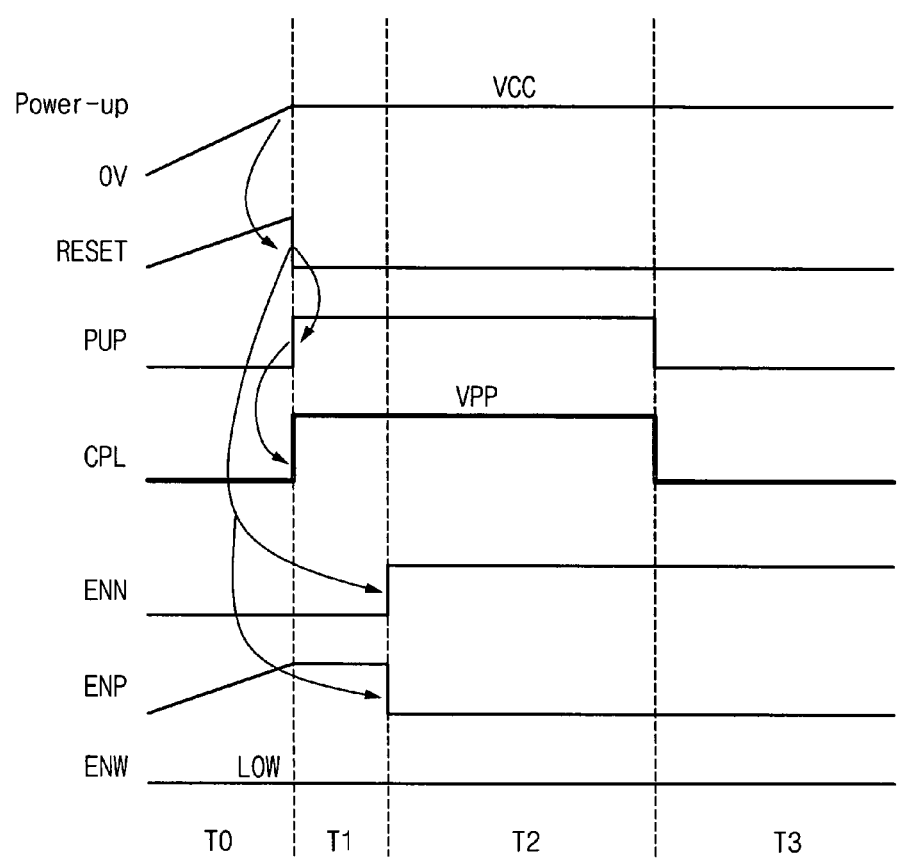
FIGS. 19 and 20 are timing diagrams in the power-up mode and the program write operation of the register in accordance with the present invention.
Figure 20:
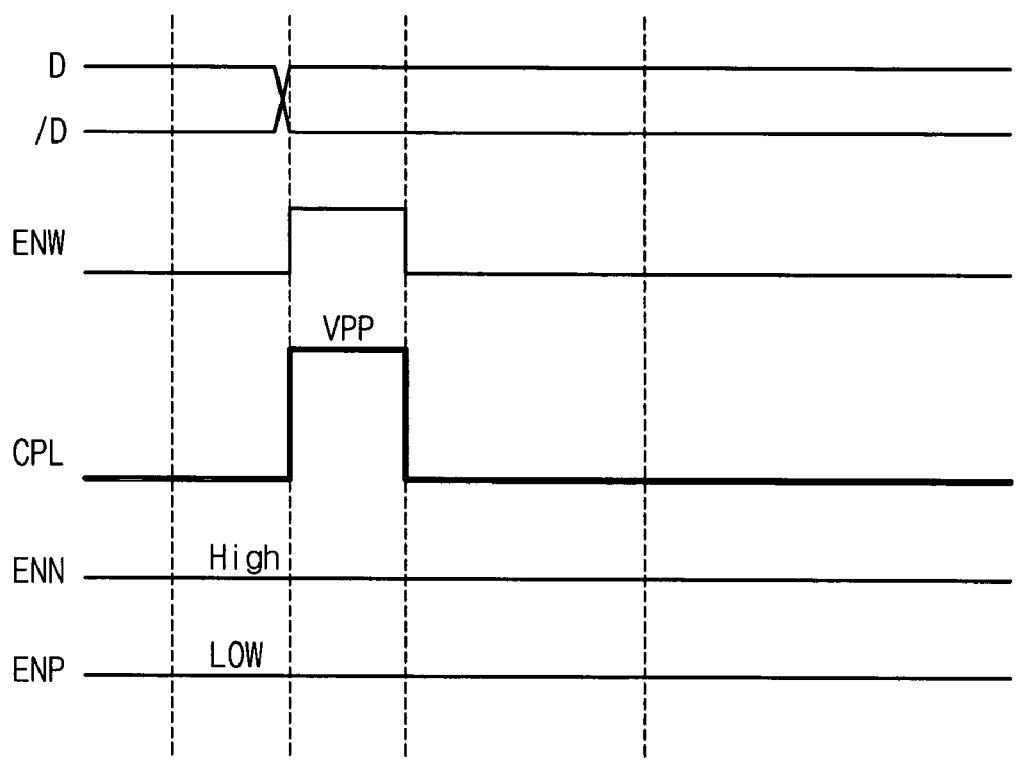

FIGS. 19 and 20 are timing diagrams in the power-up mode and the program write operation of the register in accordance with the present invention.

The operations of the register in FIGS. 19 and 20 are identical to FIGS. 9 and 10 except that the cell plate voltage CPL is pumped to the pumping voltage VPP level by the cell plate voltage control unit, and thus detailed explanations thereof are omitted.

As discussed earlier, in accordance with the present invention, the ferroelectric register improves storage reliability and stability by reducing the data storage failure probability due to the weak state capacitor, by using the plurality of capacitors connected in parallel, instead of using the single capacitor. Furthermore, the ferroelectric register obtains the data sensing margin by pumping the cell plate signal into not the power voltage level but the pumping voltage level.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A ferroelectric register, comprising:
    a pull-up switch for outputting a power voltage when a pull-up enable signal is activated;
    a pull-up driving unit for receiving the power voltage from the pull-up switch, and for pulling up a voltage of a data storage node to the power voltage;
    a write enable control unit for transmitting a differential data to the data storage node according to a write control signal;
    a ferroelectric capacitor unit including at least two ferroelectric capacitors connected in parallel between the data storage node and a plate line, and storing the differential data when a cell plate signal is activated;

a pull-down switch for transmitting a ground voltage to the data storage node when a pull-down enable signal is activated; and a pull-down driving unit for receiving the ground voltage from the pull-down switch, and for pulling down the voltage of the data storage node to the ground voltage.

2. The ferroelectric register of claim 1, wherein, in the ferroelectric capacitor unit, at least two ferroelectric capacitors share the same ferroelectric layer on the same plane.

3. The ferroelectric register of claim 1, wherein, in the ferroelectric capacitor unit, at least two ferroelectric capacitors are formed by stacking ferroelectric layers symmetrically upon and beneath a common electrode layer.

4. The ferroelectric register of claim 1, wherein, in the ferroelectric capacitor unit, at least two ferroelectric capacitors are connected in parallel between the data storage node and the ground voltage.

5. The ferroelectric register of claim 1, further comprising a cell plate voltage control unit for pumping the cell plate signal from a power voltage level to a pumping voltage level according to a cell plate control signal and a power voltage control signal.

6. The ferroelectric register of claim 5, wherein the cell plate voltage control unit comprises:

a delay unit for outputting a delay signal by delaying the cell plate control signal for a predetermined time;

a pumping unit for outputting a pumping signal by pumping the power voltage to a pumping voltage level according to the delay signal, when receiving the power voltage control signal; and a level control unit for outputting the pumped cell plate signal by level-shifting the pumping signal and the cell plate control signal.

7. The ferroelectric register of claim 5, wherein, in the ferroelectric capacitor unit, at least two ferroelectric capacitors are connected in parallel between the data storage node and the ground voltage.

8. The ferroelectric register of claim 5, wherein, in the ferroelectric capacitor unit, at least two ferroelectric capacitors share the same ferroelectric layer on the same plane.

9. The ferroelectric register of claim 5, wherein, in the ferroelectric capacitor unit, at least two ferroelectric capacitors are stacked symmetrically upon and beneath a common electrode layer.

* * * * *